United States Patent
Bosquet et al.

(10) Patent No.: US 8,864,040 B2
(45) Date of Patent: Oct. 21, 2014

(54) METHOD OF FABRICATING A MICROCIRCUIT DEVICE

(75) Inventors: Olivier Bosquet, Vitre (FR); Jean-Francois Boschet, Montreuil sur Ille (FR)

(73) Assignee: Oberthur Technologies, Colombes (FR)

( * ) Notice: Subject to any disclaimer, the term of this patent is extended or adjusted under 35 U.S.C. 154(b) by 212 days.

(21) Appl. No.: 13/310,958

(22) Filed: Dec. 5, 2011

(65) Prior Publication Data

US 2012/0138690 A1    Jun. 7, 2012

(30) Foreign Application Priority Data

Dec. 6, 2010   (FR) ...................................... 10 60110

(51) Int. Cl.
*G06K 19/06* (2006.01)
(52) U.S. Cl.
USPC ............ 235/492; 235/487; 235/375; 235/380
(58) Field of Classification Search
USPC .................................. 235/380, 375, 487, 492
See application file for complete search history.

(56) References Cited

U.S. PATENT DOCUMENTS

| | | | | | |
|---|---|---|---|---|---|
| 5,057,679 | A | * | 10/1991 | Audic et al. | 235/492 |
| 6,034,427 | A | * | 3/2000 | Lan et al. | 257/698 |
| 6,475,327 | B2 | * | 11/2002 | Tung et al. | 156/306.6 |

FOREIGN PATENT DOCUMENTS

| | | |
|---|---|---|
| EP | 0 344 058 A1 | 11/1989 |
| EP | 0 456 323 A1 | 11/1991 |
| FR | 2 779 851 A1 | 12/1999 |
| FR | 2 794 266 A1 | 12/2000 |

OTHER PUBLICATIONS

Foreign Search Report dated Jul. 8, 2011.

* cited by examiner

*Primary Examiner* — Karl D Frech
(74) *Attorney, Agent, or Firm* — Arent Fox LLP

(57) ABSTRACT

A fabrication method for a device having a body having a cavity of dimensions suitable for receiving a module having a microcircuit, the cavity having a bottom and a peripheral wall surrounding the bottom, the method including a step of putting the module into place in the cavity. More precisely, the method comprises, prior to the step of putting the module into place, a step of depositing an adhesive strip at least on a surface of the module that is designed to face the bottom of the cavity, the adhesive strip being suitable for enabling the module to adhere at least to the bottom of the cavity and for limiting a deformation stroke of the module that could occur under the effect of a mechanical compression force urging the module against the bottom of the cavity.

18 Claims, 2 Drawing Sheets

METHOD OF FABRICATING A MICROCIRCUIT DEVICE

CROSS-REFERENCE TO RELATED APPLICATION

This Application claims priority to French Patent Application No.: 1060110, filed Dec. 6, 2010, the disclosure of which is hereby incorporated in its entirety by reference.

FIELD OF THE INVENTION

The present invention relates to the technical field of portable microcircuit electronic devices, such as in particular smart cards.

The invention applies more particularly but not exclusively to contact type microcircuit cards, also known more generally as smart cards, of format in compliance with the ID-1 format defined by the ISO-7816 standard.

BACKGROUND OF THE INVENTION

Such a smart card generally comprises a body made of plastics material and provided with a cavity for receiving a microcircuit module, the module being fastened to the body, e.g. by adhesive.

At present, there exists a need to make cards, in particular smart cards, out of paper or card material. Such a material presents numerous advantages: firstly it is recyclable or indeed biodegradable, and secondly its cost is generally less than the cost of conventional plastics such as polyvinylchloride (PVC) or PVC acrylonitrile-butadiene-styrene (ABS) copolymer, as are conventionally used in the field. In addition, the use of fibrous material presents the advantage of reducing the amount of hydrochloric acid released during recycling of media forming card bodies.

Nevertheless, the use of cards made of paper presents certain drawbacks. The relatively porous nature of the fiber material medium in comparison with plastics materials makes the card generally more sensitive to compression forces.

Prior to being made available, a card needs to be subjected to various mechanical strength tests, in particular in compression. While performing such tests on paper cards, it has been found that the force to which the card is subjected is sufficient for the paper to be flattened so that it cannot accommodate significant bending of the module. Unfortunately, when the bending of the module becomes too great, the microcircuit carried by the module is liable to become damaged, or even to be made inoperative.

As a result, after performing such tests, a large number of microcircuit cards are considered to be faulty and end up being rejected during fabrication, which represents a non-negligible expense.

OBJECT AND SUMMARY OF THE INVENTION

A particular object of the invention is to remedy that drawback by proposing a method of fabricating a smart card, in particular one made of fibrous material such as paper or card, enabling the reliability of the card and its ability to withstand card strength tests to be improved, while also being very simple to implement.

To this end, the invention provides in particular a method of fabricating a device having a microcircuit, the device having a body with a cavity of dimensions suitable for receiving a module having a microcircuit, the cavity having a bottom and a peripheral wall surrounding the bottom, the method including a step of putting the module into place in the cavity, and comprising, prior to the step of putting the module into place, a step of depositing an adhesive strip at least on a surface of the module that is designed to face the bottom of the cavity, the adhesive strip being suitable for enabling the module to adhere at least to the bottom of the cavity and for limiting a deformation stroke of the module that could occur under the effect of a mechanical compression force urging the module against the bottom of the cavity.

By means of the invention, the adhesive strip enables the module to adhere to the body, while also forming an interface suitable for absorbing deformation of the module when it is subjected to a force compressing it against the bottom of the cavity. By means of this mechanical absorption action, the module is preserved from excessive bending that might lead to its destruction.

In a particular implementation of the invention, the body of the device is made of a fibrous material, such as paper, or indeed card.

Preferably, the adhesive strip is activatable under the effect of heat, and the method includes a step of preheating the cavity prior to the step of putting the module into place. This serves to facilitate adhesion between the strip and the cavity without giving rise to excessive heating of the micromodule. The micromodule is thus preserved from temperature stress.

In a preferred implementation of the invention, the adhesive strip is activatable under the effect of heat, and the method includes a step of heating the strip and the module in order to enable the strip to adhere to the surface of the module.

Preferably, the module defines an inside surface facing towards the cavity and an outside surface facing towards the outside of the cavity, and the adhesive strip is placed in such a manner as to cover substantially all of the inside surface of the module. The strip thus forms an effective absorption interface over the entire surface area of the module.

In a preferred implementation, the peripheral wall includes a step defining a bearing surface for the module once the module is in place, and the adhesive strip extends at least in part over the bearing surface.

In a preferred implementation, the method includes a step of fastening a central portion of the module to the cavity by cold pressing and a step of fastening a peripheral portion of the module to the cavity by hot pressing. This serves to avoid combining temperature stress and compression mechanical stress in the center of the module, where such a combination might have the effect of damaging the module. Preferably, the hot pressing step precedes the cold pressing step.

In a preferred implementation, the step of fastening by hot pressing consists in applying compression to the periphery of the module by means of a recessed presser plate.

The invention also provides a device having a microcircuit, the device comprising a body provided with a cavity dimensioned to receive a module with a microcircuit, the cavity having a bottom and a peripheral wall surrounding the bottom, wherein the device is made by a method of the invention.

Preferably, the strip is made of a heat-activatable adhesive material.

In a preferred embodiment, the peripheral wall of the cavity is provided with a bearing rim for the support of the module, the rim and the bottom together defining a step, and the strip enabling the module to adhere to the bottom and to the rim of the cavity.

In a preferred embodiment, the module is defined by an inside surface facing towards the inside of the cavity, and the strip forms a wrapping that fits substantially to the shape of the inside surface of the module.

The device is preferably a smart card.

BRIEF DESCRIPTION OF THE FIGURES

Other characteristics and advantages of the invention appear in the light of the following description made with reference to the accompanying drawings, in which.

DETAILED DESCRIPTION OF A PREFERRED EMBODIMENT OF THE INVENTION

Figure 1:
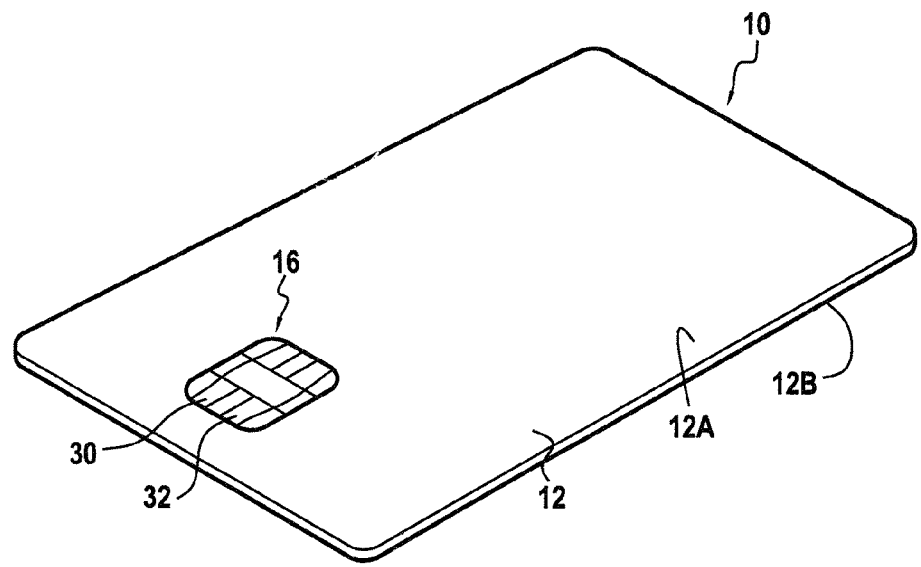
FIG. 1 shows a smart card of the invention.

FIG. 1 shows a microcircuit device of the invention. This device is given overall reference 10.

In the example described, the microcircuit device 10 is a smart card. In a variant, the device 10 could be a page of a passport such as the cover of the passport, or indeed it could be an adhesive label or "sticker".

As shown in FIG. 1, the device 10 comprises a body 12 that is generally card-shaped, defining first and second opposite faces 12A and 12B.

In this embodiment, the body 12 defines the outside dimensions of the card 10. In this example, and preferably, the dimensions of the card 10 are defined by the ID-1 format of the ISO 7816 standard, which is the format conventionally used for bank cards, having dimensions of 85.6 millimeters (mm) by 53.98 mm and thickness that is substantially equal to eight hundred micrometers. Naturally, other card formats could also be used.

The card body 12 is preferably made of a fibrous material, e.g. based on natural and/or synthetic fibers. For example, the body is made of card or of paper. Nevertheless, in a variant of the invention, the body 12 may be made of a plastics material.

In conventional manner, the device 10 includes a microcircuit 14 suitable for communicating with an external terminal, for processing and/or storing data. In accordance with the invention, the body 12 incorporates a microcircuit module 16 that includes the microcircuit 14.

In the example described, the module 16 comprises a support 18 carrying the microcircuit 14. Thus, as shown in FIG. 2, the support 18 defines first and second opposite faces 18A and 18B, referred to respectively as the outside face and the inside face, the outside face 18A facing towards the outside of the card 10.

By way of example, the support 18 is made of epoxy type glass fibers, of polyester, or indeed of paper, and it presents thickness lying for example in the range fifty micrometers to two hundred micrometers. In an alternative solution, the support 18 may be made of a plastics material based essentially on polyimide, having thickness of about seventy micrometers.

Figure 2:
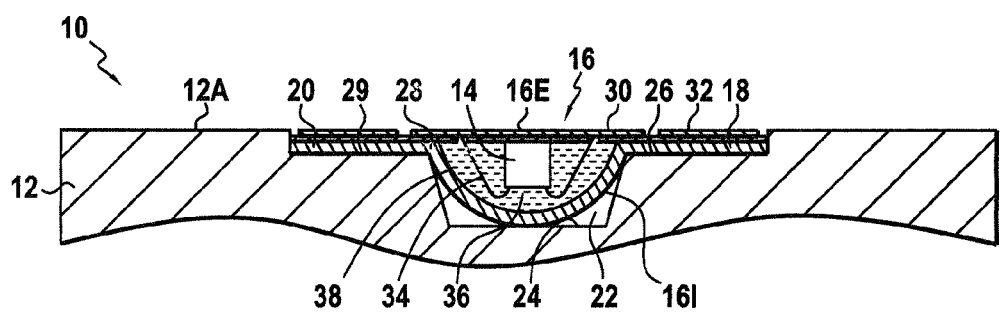
FIG. 2 is a section view of the card on line 2-2 in FIG. 1.

In addition, in this example, and as shown in FIG. 2, the body 12 includes a cavity 20 for housing the module 16. The cavity 20 is preferably formed in the body 12 and opens out into one of the faces 12A of the body 12, e.g. its first face 12A.

By way of example, and as shown in FIG. 2, the cavity 20 has a deep central zone 22 with a bottom 24 for housing the microcircuit 14, and a peripheral zone 26 that is raised relative to the central zone 24, thereby defining a step 28 relative to the bottom 24. This peripheral zone 26 has a bearing surface 29 that is raised relative to the bottom 24 of the cavity 20 and against which the edges of the support 18 of the module 16 rest.

Such a cavity 20 is generally obtained by machining, typically by milling or by spot-facing, in two operations:

a large spot-facing to form the peripheral zone 26 corresponding to the depth of the step 28; and a small spot-facing to form the deeper central zone 22.

By way of example, in order to communicate with an external terminal, the card 10 has an outside interface 30 of contact areas 32 electrically connected to the microcircuit 14. This interface 30 enables communication to be established by the card 10 making contact with some other external terminal, for example when the card 10 is inserted into a suitable card reader.

In the example described, the interface 30 comprises a series of metal electrical contact areas 32 complying with a predefined smart card standard. For example, the contact areas comply with the ISO 7816 standard. The interface 30 of the card 10 is preferably made in a layer of metal such as copper, but in a variant it could also be made by screen-printing electrically conductive ink of the type comprising epoxy filled with silver or gold particles or by screen-printing an electrically conductive polymer.

In conventional manner, the areas 32 are electrically connected to the microcircuit 14 by electrically-conductive wires, e.g. such as gold wires passing through wells formed in the support 18 of the module 16.

For example, and as shown in FIG. 2, in this embodiment, the microcircuit 14 is mounted using an assembly method commonly known as wire bonding. In this assembly method, the microcircuit 14 is mounted so that its passive face is arranged facing the support 18 of the module 16.

Under such circumstances, electrically-conductive wires 34 connect the active face of the chip or microcircuit to the appropriate conductive elements of the support (such as electrically-conductive tracks forming the ends of an antenna). Preferably, and as shown in FIG. 2, the microcircuit 14 and the wires 34 are encapsulated in a plug of polymer resin 36.

In a variant that is not shown in the figures, the chip 14 may be assembled using some other assembly method, such as for example a method known as the "flip-chip" method. Under such circumstances, and unlike the wire-bonding method, the active face of the microcircuit is mounted facing the support via contacts of the microcircuit that are in the form of metal bulges or beads together with electrically-conductive adhesive. The chip is mounted and flipped over during assembly so that the bulges or the beads become bonded to the conductive elements of the module support.

In the example described, the support 18 and the microcircuit 14 together form the module 16. The module 16 is preferably defined by an inside surface 16I and by an outside surface 16E.

In order to fasten the module 16 in the cavity 20, the device 10 includes an adhesive strip 38 arranged between the module 16 and at least the bottom 24 of the cavity 20. In accordance with the invention, this strip 38 is suitable for limiting a deformation stroke of the module 16 that may occur under the effect of a mechanical compression force urging the module 16 against the bottom 24 of the cavity 20.

As shown in FIG. 2, and preferably, the strip 38 is arranged on the inside surface 16I of the module 16 that faces towards the inside of the cavity 20 so as to cover substantially all of the inside surface 16I of the module 16. This presents the advantage of optimizing the adhesive bonding area between the module 16 and the cavity 20.

In the example described, the inside surface 16I of the module 16 presents a dome-shaped profile. In addition, in the example described, the outside surface 16E is substantially plane and carries the interface 30 of contact areas 32.

The strip 38 is preferably permanently in contact with the bottom 24 of the cavity 20. For example, the strip 38 is also fastened to the bottom 24 of the cavity 20. The strip 38 is preferably made of an elastically-deformable material. Furthermore, the material of the strip 38 is preferably a heat-activatable adhesive. By way of example, the thickness of the adhesive strip 38 lies in the range 10 micrometers (μm) to 100 μm, and preferably in the range 40 μm to 60 μm. In the example described, the strip 38 has a thickness of about 50 μm.

The strip 38 preferably presents two adhesive faces, one of the faces being applied directly to the surface of the module 16. The strip 38 is thus formed of a mass of adhesive material commonly referred to as "transfer adhesive", being made for example out of a material that essentially comprises copolyamide, polyester, etc.

In this embodiment of the invention, the strip 38 is preferably placed on the inside surface 16I of the module 16 so as to cover substantially all of the inside surface 16I.

With reference to FIGS. 4 to 7, there follows a description of the main steps in fabricating the device 10 of the invention having a microcircuit 14.

Initially, the method comprises a step of depositing an adhesive strip 38 at least on the surface 16I of the module 16 that is to face the bottom 24 of the cavity 20.

Figure 4:
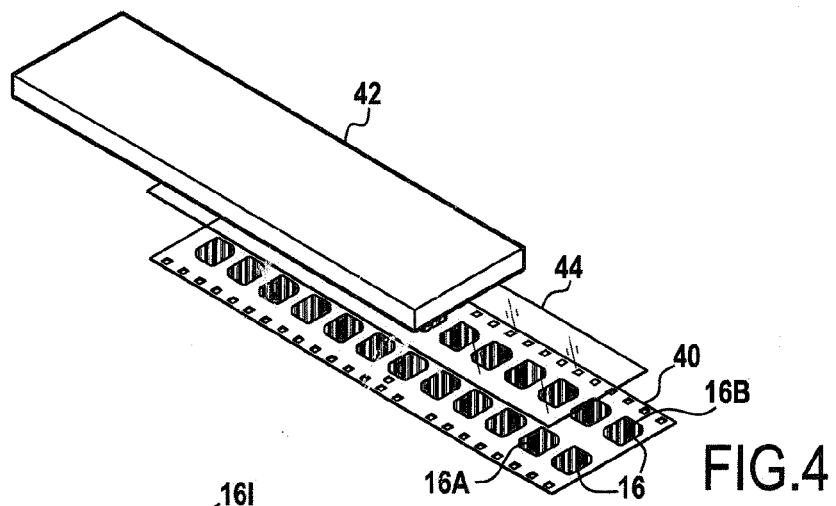
FIGS. 4 to 7 show steps in the fabrication of the FIG. 1 card.

In this example, a film 40 having two rows 16A and 16B of micromodules 16 is initially unwound so as to be laid out flat, as shown in FIG. 4. In order to cover each module 16 of the film 40 in an adhesive strip 38, an adhesive strip 44 is placed on the film 40, the strip 44 having a surface of dimensions that correspond substantially to the dimensions of the film 40. This enables the inside surface 16I of each micromodule 16 of the film 40 to be covered with a portion of the adhesive strip 44 corresponding to the strip 38.

Figure 5:
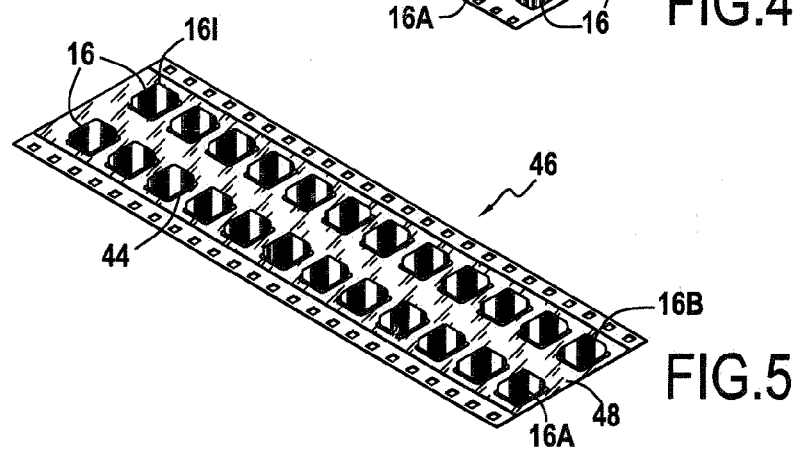
Figure 6:
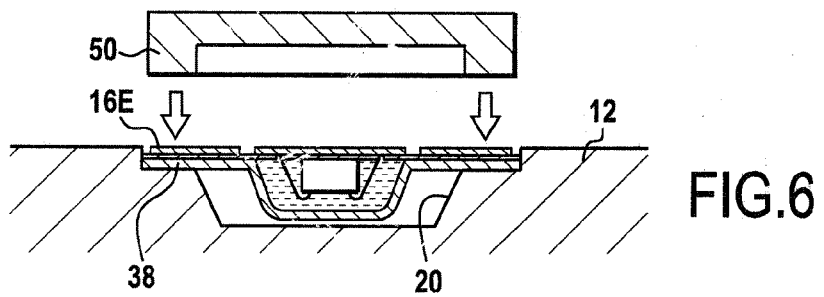

In order to make the adhesive strip 44 adhere to the film 40 of micromodules 16, a presser plate 42 is pressed against the assembly so as to obtain the element 46 as shown in FIG. 5. The adhesive strip 44 fits closely to the shape in relief of the film 40, thereby enabling each micromodule 16 to be wrapped in a portion of the strip 44. During this step, and preferably, since the adhesive strip 44 is heat-activatable, the strip 44 and the modules 16 are heated so as to enable each portion of the strip 44 to adhere to the inside surface 16I of each module 16.

Thereafter, during a step that is not shown in the figures, a cutting-out machine including a punch member cuts out respective parts 48, each formed by one of the micromodules together with its adhesive wrapping as formed by the strip portion 38.

In order to put the module 16 into place in the cavity 20 of the body 12, the method preferably includes a step of preheating the cavity 20, e.g. to 250° C. In this implementation, the fibrous nature of the material constituting the body of the card 12 withstands such high temperatures, unlike a plastic medium, e.g. of the PVC type. Preheating is thus possible in these circumstances because of the fibrous nature of the card body. This serves to facilitate adhesive bonding between the strip 38 and the card body. The module 16 and the strip 38 are preferably likewise preheated, e.g. to 250° C.

In the example described, the cavity 20 has a bottom 24 and a peripheral wall 26 with a step 28 defining a deep central zone and a peripheral zone that is raised relative to the bottom 24.

By way of example, the machine then also includes a transfer member provided with suction-cup type gripper means, so the transfer member takes hold of the part by suction and places it in the cavity 20 of the card body 12.

The method also includes a step of fastening the module 16 in the cavity 20. In this example, the micromodule 16 is fastened in two steps:
a first step comprising hot pressing (FIG. 6); and
a second step comprising cold pressing (FIG. 7).

In this preferred implementation, the hot pressing step precedes the cold pressing step. This makes it possible in particular to take advantage of the preheating previously carried out on the cavity.

The first pressing step consists in applying a press to the periphery of the module 16 against the outside surface 16E of the module 16 e.g. in order to fasten it to the peripheral margin of the cavity 20 by means of the strip 38. As shown by way of example in FIG. 6, during this first fastening step, a presser plate 50 that is recessed in its center is pressed against the outside surface 16E of the micromodule 16. In the example described, during this step, the plate 50 exerts a compression force solely against the periphery of the outside surface 16E of the module 16, and not against the center of the module 16. The assembly is also preferably heated so as to achieve effective activation of the adhesive mass 44. This enables the module 16 to be fastened to the edge of the cavity 20 without exposing the micromodule 14 of the module 16 to heat stress combined with a compression force.

Figure 7:
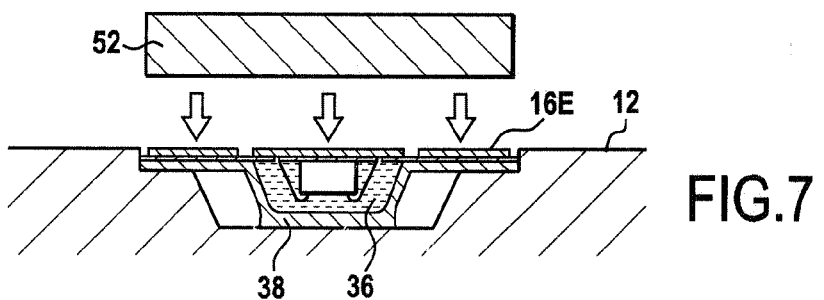

During the second step, as shown in FIG. 7, a presser plate 52 is pressed in particular against the center of the outside surface 16E in order to fasten the module 16 to the bottom 24 of the cavity 20. Under such circumstances, the presser plate 52 does not have a central recess, thereby enabling it to apply compression in particular against the central portion of the outside surface 16E of the module 16 lying substantially in register with the microcircuit 14 and also with the peripheral portion of said surface 16E. Because this step is performed cold, the stresses exerted on the microcircuit 14 are relatively limited and the microcircuit 14 does not run any risk of being damaged solely by the compression force. This second step enables the adhesive strip 38 to bond adhesively with the bottom 24 of the cavity 20. Under the effect of the mechanical stress, the adhesive strip 38 adheres to the bottom of the cavity 20 of the card body 12 by deforming.

Optionally, and preferably, the change in temperature between the two steps takes place progressively and not suddenly. For example, during the hot pressing step, the recess pressure is applied three or four times at decreasing temperatures lying in the range 170° C. to 110° C., after which the solid presser is applied once while cold.

There follows a description of the main aspects of the operation of the device of the invention as described in particular with reference to the above figures.

Figure 3:
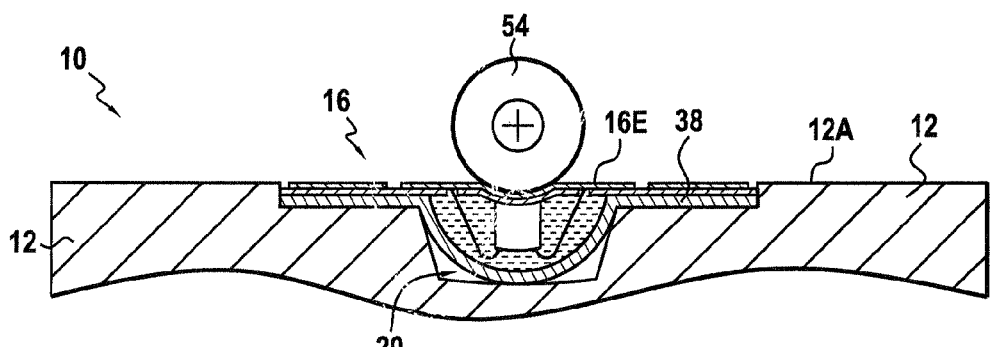
FIG. 3 is a view of the FIG. 1 card during a test step.

FIG. 3 is a diagram showing a step of testing the mechanical strength of the card 10. This test is more specifically referred to as the wheel test. A wheel 54 is shown diagrammatically in the figure.

When the wheel 54 is pressed against the module 16, the module is subjected to a compression force directed towards the bottom 24 of the cavity 20. By means of the invention the adhesive strip 38 enables the deformation of the module 16 to be contained and prevents the module from flexing excessively, where such flexing might in particular lead to the microcircuit being destroyed.

The interface 38 that extends between the bottom 24 of the cavity and the inside surface 16I of the module 16 serves to absorb the mechanical forces exerted on the microcircuit, thereby enabling the stresses to be offset into the adhesive strip.

The above description relates merely to potential examples of the invention, which is not limited thereto.

What is claimed is:

1. A method of fabricating a device having a microcircuit, comprising
   providing a device having a body with a cavity of dimensions suitable for receiving a module having a microcircuit, the cavity having a bottom and a peripheral wall surrounding the bottom, the peripheral wall comprising a step structure defining a bearing surface for the module once the module is in place;
   depositing an adhesive strip at least on a surface of the module that faces the bottom of the cavity; and
   subsequently putting the module into place in the cavity,
   wherein the adhesive strip is deposited to adhere to a surface of the module that faces the step structure defining a bearing surface and to adhere to the surface of the module that is designed to face the bottom of the cavity, and
   wherein putting the module into place includes fixing the module to the step structure defining a bearing surface through the adhesive strip.

2. A method according to claim 1, wherein the adhesive strip is activatable under the effect of heat, and the method includes a step of preheating the cavity prior to the step of putting the module into place.

3. A method according to claim 1, wherein the adhesive strip is activatable under the effect of heat, and the method includes a step of heating the strip and the module in order to enable the strip to adhere to the surface of the module.

4. A method according to claim 1, wherein the module defines an inside surface facing towards the cavity and an outside surface facing towards the outside of the cavity, and the adhesive strip is placed in such a manner as to cover substantially all of the inside surface of the module.

5. A method according to claim 1, wherein the method includes a step of fastening a central portion of the module to the cavity by cold pressing and a step of fastening a peripheral portion of the module to the cavity by hot pressing.

6. A method according to claim 5, wherein the hot pressing step precedes the cold pressing step.

7. A method according to claim 5, wherein the step of fastening by hot pressing consists in applying compression to the periphery of the module by means of a recessed presser plate.

8. A method according to claim 1, wherein the body is in a fibrous material.

9. A method according to claim 1, further comprising a step of fastening the module at least to the bottom of the cavity through the adhesive strip.

10. A method according to claim 1, wherein the adhesive strip has a thickness of 10-100 µm.

11. A device having a microcircuit, comprising
    a body provided with a cavity dimensioned to receive a module with a microcircuit, wherein the cavity has a bottom and a peripheral wall surrounding the bottom, and
    wherein the peripheral wall comprises
    a step structure defining a bearing surface for the module, and
    an adhesive strip provided at least on a surface of the module facing the bottom of the cavity,
    wherein the adhesive strip extends at least in part over the bearing surface and adheres to the surface of the module facing the bottom of the cavity, and
    wherein the module is fixed to the step structure defining a bearing surface through the adhesive strip.

12. A device according to claim 11, wherein the strip is made of a heat-activatable adhesive material.

13. A device according to claim 11, wherein the peripheral wall of the cavity is provided with a bearing rim for the support of the module, the rim and the bottom together defining a step, and the strip enabling the module to adhere to the bottom and to the rim of the cavity.

14. A device according to claim 11, wherein the module is defined by an inside surface facing towards the inside of the cavity, and the strip forms a wrapping that fits substantially to the shape of the inside surface of the module.

15. A device according to claim 11, the device being a smart card.

16. A device according to claim 11, wherein the body is in a fibrous material.

17. A device according to claim 11, wherein the adhesive strip enables the module to adhere at least to the bottom of the cavity.

18. A device according to claim 11, wherein the adhesive strip has a thickness of 10-100 µm.

* * * * *